(12) United States Patent
Carrier et al.

(10) Patent No.: US 7,265,645 B2
(45) Date of Patent: Sep. 4, 2007

(54) MATCHED-IMPEDANCE HIGH-BANDWIDTH CONFIGURATION JUMPER

(75) Inventors: Patrick W. Carrier, Round Rock, TX (US); John S. Loffink, Austin, TX (US)

(73) Assignee: Dell Products L.P., Austin, TX (US)

( * ) Notice: Subject to any disclaimer, the term of this patent is extended or adjusted under 35 U.S.C. 154(b) by 279 days.

(21) Appl. No.: 11/146,316

(22) Filed: Jun. 3, 2005

(65) Prior Publication Data

US 2006/0272852 A1 Dec. 7, 2006

(51) Int. Cl.
*H03H 7/38* (2006.01)
(52) U.S. Cl. .......................... 333/33; 174/261; 333/4; 333/5
(58) Field of Classification Search ............... 174/261; 333/33; 710/104; 361/803
See application file for complete search history.

(56) References Cited

U.S. PATENT DOCUMENTS 6,265,952 B1 * 7/2001 Kan ............................ 333/33
2004/0196062 A1 * 10/2004 Fuller et al. ................. 326/30

OTHER PUBLICATIONS

"Board Design Guidelines for PCE Express™ Interconnect," PCI-SIG Developers Conference, Intel corporation, http://www.hep.ph.ic.ac.uk/calice/elecLongterm/040728ucl/PCI_Express_PCB_Guidelines.pdf, printed Oct. 19, 2005.
"Impedance Matching," Throughput Solutions, http://www.adc.com/krone/literature/brochures/bro_imp.pdf, printed Oct. 19, 2005.
"The Many Flavors of LVDS," National Semiconductor, http://www.national.com/nationaledge/feb02/flavors.html, printed Oct. 19, 2005.
"An Overview of LVDS Technology," National Semiconductor Corporation, Jul. 1998 http://www.national.com/an/AN/AN-971.pdf#page=1, printed Oct. 19, 2005.
D. Lewis, "LVDS: Five Tips for Buffering Signal Integrity," Communications Design China—Conference Proceedings, http://www.eetasia.com/ARTICLES/2001AUG/2001AUG09_RFD_EDA_TAC.PDF, printed Oct. 19, 2005.
"Virtex™ E High- Performance Differential Solutions: Low Voltage Differential Signaling (LVDS)," http://www.xilinx.com/products/virtex/techtopic/vtt009.pdf, Sep. 28, 2000.

* cited by examiner

*Primary Examiner*—Dean A. Reichard
*Assistant Examiner*—Abiy Getachew
(74) *Attorney, Agent, or Firm*—Hamilton & Terrile, LLP; Gary W. Hamilton

(57) ABSTRACT

The present invention provides a matched-impedance jumper that is operable to connect pairs of differential signal conductors to provide improved signal transmission characteristics. In an embodiment of the invention, the impedance-matched jumper is used to connect a first pair of differential signal conductors to a selected pair of differential signal conductors selected from a plurality of second pairs of differential signal conductors. The impedance-matched jumper comprises a plurality of input pins that are operable to connect with a plurality of connection pads on the first pair of differential signal conductors and a plurality of output pins operable to connect with a plurality of connection pads on the predetermined second pair of differential signal conductors. A plurality of internal conductors are operably connected to the input pins and the output pins to define a signal path therebetween. The signal path defined by the input pins, the output pins, and the internal conductors provides an impedance-matched passthrough for differential signals.

20 Claims, 8 Drawing Sheets

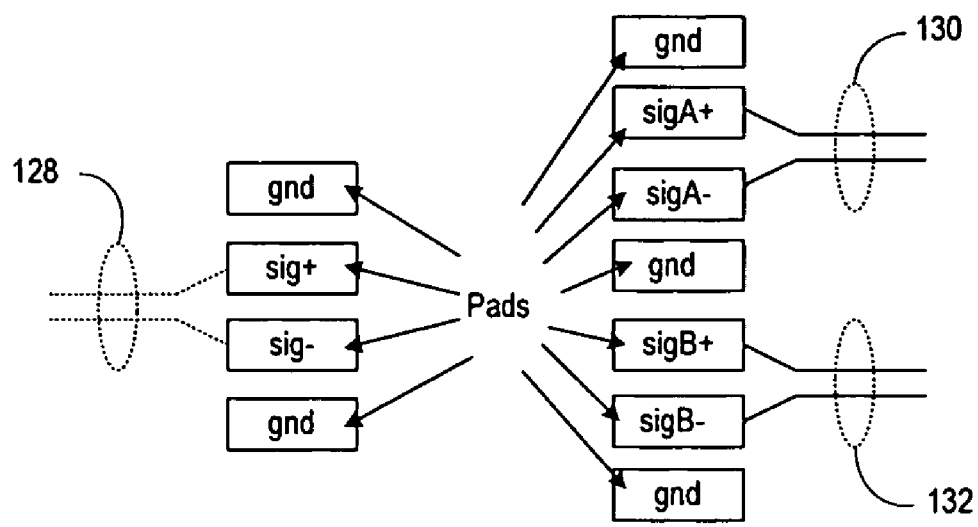
*Figure 8*
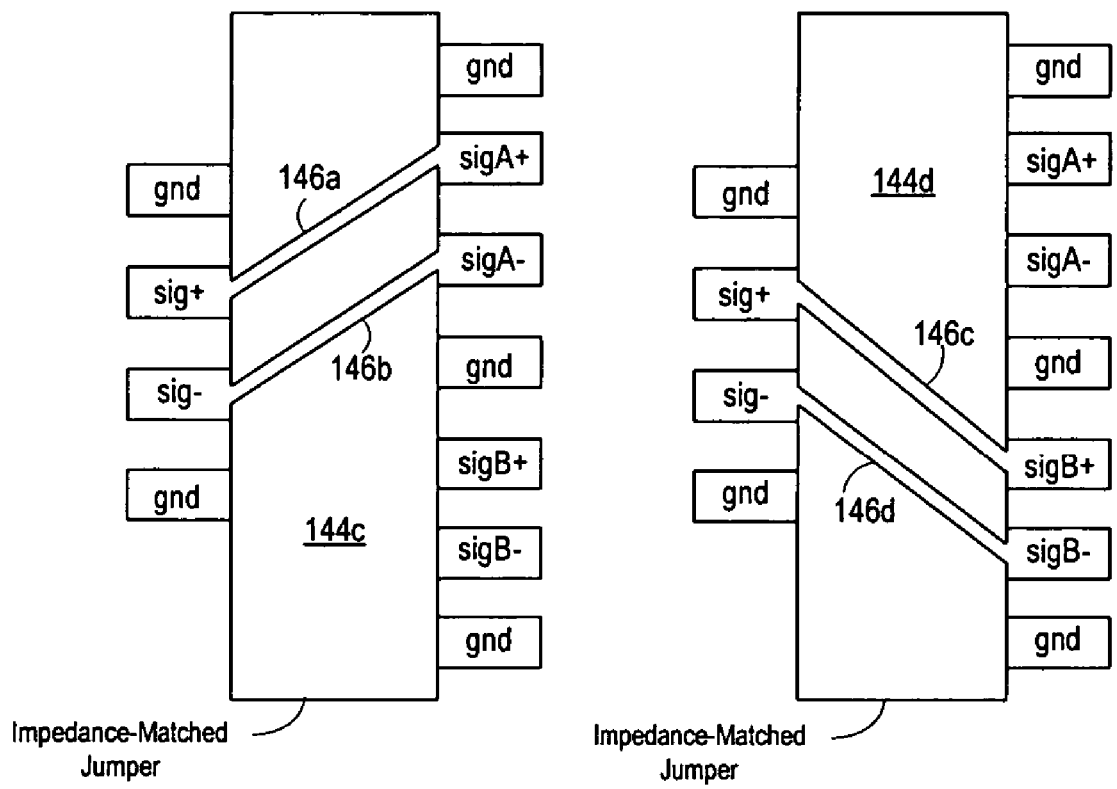
*Figure 9a*  *Figure 9b*

MATCHED-IMPEDANCE HIGH-BANDWIDTH CONFIGURATION JUMPER

BACKGROUND OF THE INVENTION

1. Field of the Invention

The present invention relates generally to circuit boards used in information handling systems. More specifically, the present invention provides an improved method and apparatus for improving the signal transfer characteristics of conductors, particularly differential signal conductors, used on circuit boards in information handling systems.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As computers have increased in performance, it has become necessary to use higher data bit rates in high-density circuitry. High speed low-voltage differential signaling (LVDS) is increasingly used across multiple interfaces to provide the most efficient means for transferring data for high-speed protocols, including PCI-E, InfiniBand, SAS, FC, and SATA. LVDS uses a pair of conductors carrying signals of opposite polarity to transmit data. There are currently many buses that use LVDS to transmit data in the Gigahertz range. These buses require very fast edge rates to support the signal integrity of the digital waveforms they produce.

High speed signals require precise matching of signal pairs to avoid reflections of the signal. The connections used to transport high speed signals are generally point-to-point connections because the high speed signals cannot tolerate stubs that cause reflections and signal degradation.

In prior art circuit boards, it is not feasible to route high-speed LVDS signals to multiple locations. Most prior art circuit boards use "quick-switches" or zero-ohm resistors (jumpers) to connect signal conductors. Quick-switches pass the signals through a field-effect transistor (FET) or a series of FETs which generate RLC parasitics that degrade high-speed signals. Because of physical board routing constraints, routing the signals through zero-ohm resistors inevitably creates an impedance discontinuity, or "impedance bump" in the routing. The impedance bump creates reflections along the signal and also degrades the intrapair differential coupling ratio, thereby increasing the effects of local EMI sources on the conductor pair.

As signal routing speeds for differential signals exceed three gigabits per second (Gbps), problems with impedance mismatches and associated reflections will be exacerbated. It is apparent, therefore, that there is a need for an improved method and apparatus for connecting LVDS conductor pairs to avoid the problems associated with prior art connectors, as described hereinabove.

SUMMARY OF THE INVENTION

The present invention overcomes the shortcomings of the prior art by providing a matched-impedance jumper that is operable to connect pairs of differential signal conductors to provide improved signal transmission characteristics. In an embodiment of the invention, an information handling system comprises at least one circuit board having a plurality of information processing elements and pairs of differential signal conductors thereon. An impedance-matched jumper is used to connect a first pair of differential signal conductors to a predetermined second pair of differential signal conductors selected from a plurality of second pairs of differential signal conductors on the circuit board.

The impedance-matched jumper comprises a plurality of input pins that are operable to connect with a plurality of connection pads on the first pair of differential signal conductors and a plurality of output pins operable to connect with a plurality of connection pads on the predetermined second pair of differential signal conductors. The impedance-matched jumper comprises a plurality of internal conductors that are operably connected to the input pins and the output pins to define a signal path therebetween. The signal path defined by the input pins, the output pins, and the internal conductors provides an impedance-matched passthrough for differential signals.

In one embodiment of the invention, the plurality of input pins and the plurality of output pins are adjacent to a plurality of ground pins to provide improved signal transmission performance. The geometry and spacing of the connection pins and the internal conductors are configured to provide a matched-impedance passthrough for differential signals to prevent impedance discontinuities that can create adverse signal reflections and degrade the intrapair differential coupling ratio of the differential signal conductor pairs.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 8 is an illustration of a configuration of conductor pads and associated ground pads for a first differential signal input conductor pair and first and second differential signal output conductor pairs.

FIG. 9a is an illustration of a matched-impedance, high-bandwidth jumper operable to connect a first differential signal input conductor pair to a first differential signal output conductor pair using the conductor configuration illustrated in FIG. 8.

FIG. 9b is an illustration of a matched-impedance, high-bandwidth jumper operable to connect a first differential signal input conductor pair to a second differential signal output conductor pair using the conductor configuration illustrated in FIG. 8.

DETAILED DESCRIPTION

Figure 1:
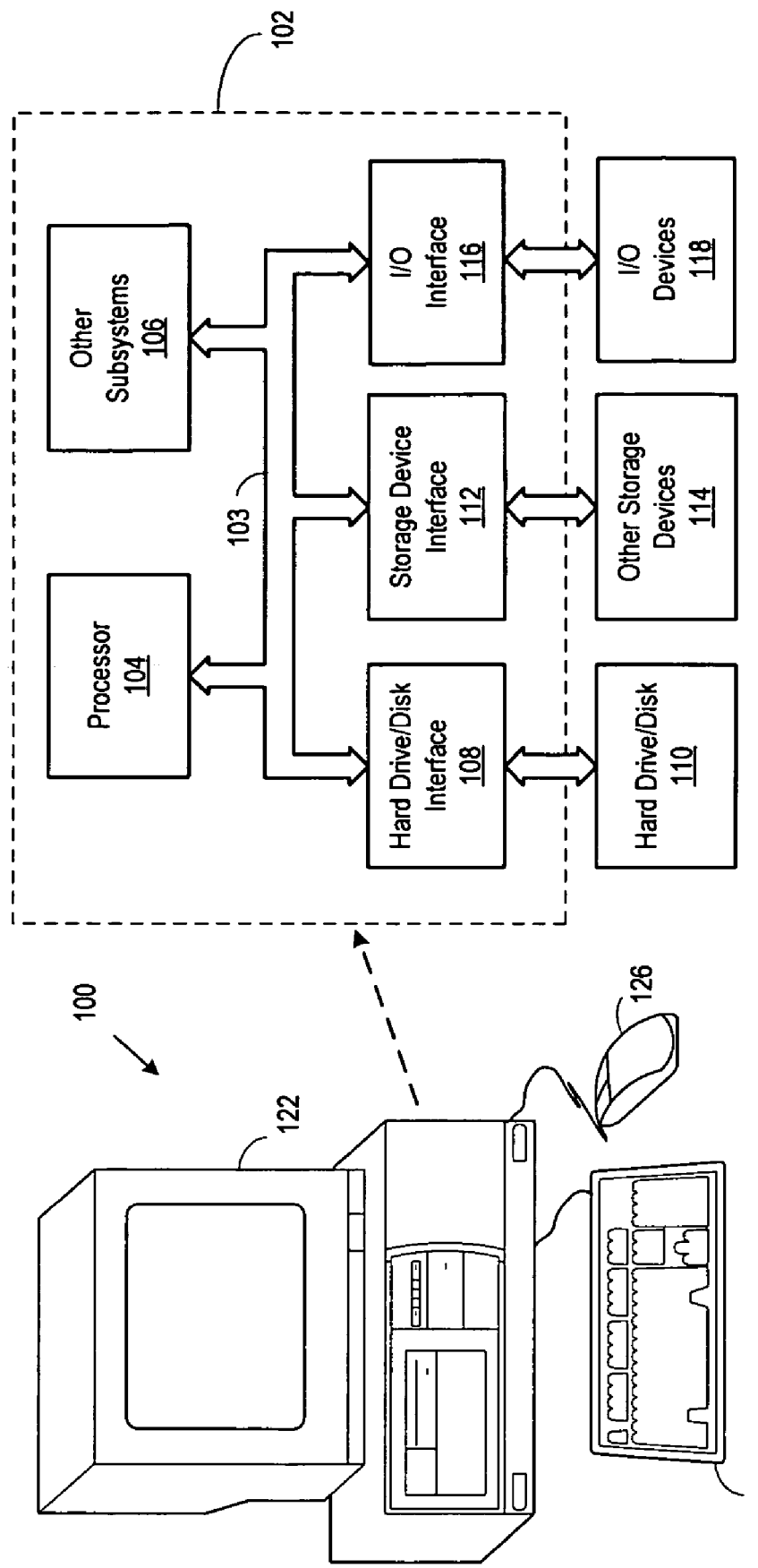
FIG. 1 is a general illustration of components of an information handling system in accordance with the present invention.

The method and apparatus of the present invention provides significant improvements in the manufacture and use of circuit boards such as those used in an information handling system 100 shown in FIG. 1. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring to FIG. 1, the information handling system 100 includes a main system board 102 that comprises a processor 104 and various other subsystems 106 understood by those skilled in the art. Data is transferred between the various system components via various data buses illustrated generally by bus 103. A hard drive 110 is controlled by a hard drive/disk interface 108 that is operably connected to the hard drive/disk 110. Likewise, data transfer between the system components and other storage devices 114 is controlled by storage device interface 112 that is operably connected to the various other storage devices 114, such as CD ROM drives, floppy drives, etc. An input/output (I/O) interface 116 controls the transfer of data between the various system components and a plurality of input/output (I/O) devices, such as a display 122, a keyboard 124, a mouse 126.

Figure 2:
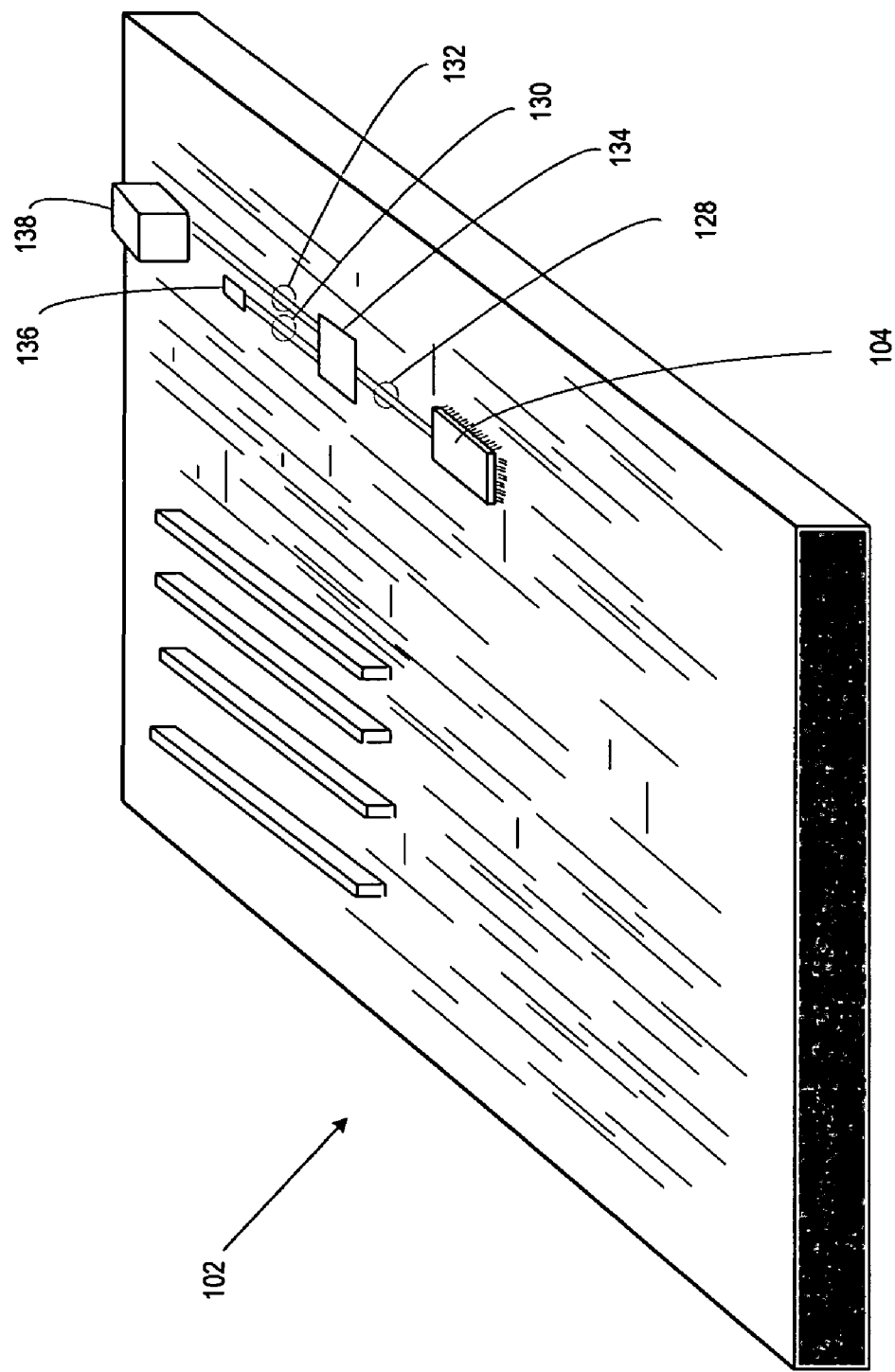
FIG. 2 is a general illustration of a circuit board comprising a matched-impedance, high-bandwidth jumper for connecting a first differential conductor pair with a second differential conductor pair in accordance with the present invention.

FIG. 2 is a generalized illustration of a printed circuit board such as system board (or motherboard) 102 discussed above in connection with FIG. 1. Circuit boards, such as the circuit board 102 shown in FIG. 2, often employ LVDS conductor pairs, such as the conductor pair denoted by reference numeral 128, to transmit data signals to and from a processor 104. For manufacturing efficiency it is common to fabricate a circuit board with a plurality of conductors that can be connected (or left unconnected) to configure the circuit board for a particular application. A jumper can be used during the manufacturing process to connect a first conductor pair carrying data signals to a second conductor pair to route signals to various system components in accordance with a predetermined configuration. For example, a jumper or switch, illustrated generally by reference numeral 134, can be used to connect the conductor pair 128 to conductor pair 130 to transmit signals to a specific destination, such as internal connector 136. Alternatively, the jumper or switch 134 can be used to connect the conductor pair 128 to conductor pair 132 to transmit signals to an external connector 138. As was discussed hereinabove, prior art jumpers, such as zero-ohm resistors, and prior art switches, such as quick-switches, cause degradation of the signals transported by the LVDS conductor pairs, especially at very high data rates.

Figure 3:
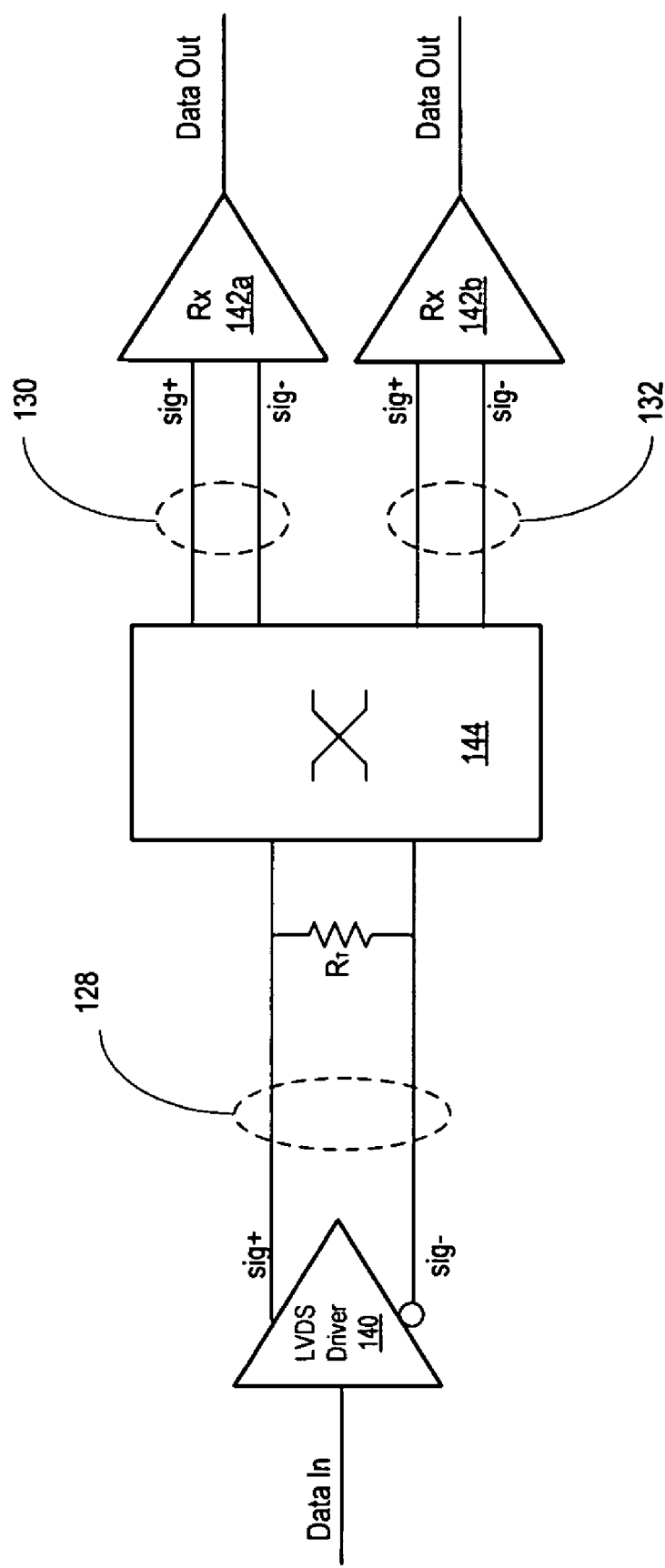
FIG. 3 is an illustration of an LVDS system for transmitting data from a transmitter to two possible receivers.

FIG. 3 is an illustration of a matched-impedance, high-bandwidth connector 144 in a point-to-point LVDS configuration for transmitting data from an LVDS driver 140 to one of two possible receivers 142a or 142b. The impedance controlled jumper 144 is operable to connect the differential conductor pair 128 with the differential conductor pair 130 or the differential conductor pair 132 depending on the configuration of the information handling system. As will be understood by those of skill in the art, the LVDS signaling protocol provides for a positive signal to be placed on one conductor and a negative signal to be placed on the other conductor of the differential conductor pair. In most configurations for point-to-point data transmission, the characteristic impedance $Z_0$ of the differential conductor pair is 100 ohms. The LVDS configuration shown in FIG. 3 is an illustrative example of a data transmission system wherein the matched-impedance jumper of the present invention can be used to improved data transmission. While this specific example has been illustrated for discussion purposes, the present invention can be used to improve data transmission in any system employing differential signaling techniques.

Specific embodiments for the matched-impedance jumper 144 of the present invention are illustrated in more detail below in FIGS. 4-11. As will be understood by those of skill in the art, matched-impedance refers to the condition in which the impedance of a component or circuit is equal to the internal impedance of the source, or the surge impedance of a transmission line, thereby giving maximum transfer of energy from source to load, minimum reflection, and minimum distortion. The signal loss associated with the reflection of signals resulting from an impedance mismatch is determined by the reflection coefficient, r, that can be calculated using following formula:

$$\Gamma = \frac{v_r}{v_i} = \frac{z_t - z_0}{z_t + z_0};$$

where:
$v_r$=reflected voltage
$v_i$=incident voltage
$z_t$=termination impedance
$z_0$=characteristic impedance Other factors relating to impedance matching include: 1) the size and shape of the signal conductors, 2) the material used to make the conductors, 3) the spacing between the conductors, 4) the size and type of ground associated with the conductors, 5) the distance between the conductors and the ground, and 6) the effective dielectric constants of the operating environment (e.g., air) and materials used to manufacture the circuit board and substrate materials used in the jumper. In accordance with the present invention, each of the aforementioned factors is optimized to provide an impedance-matched jumper to provide optimum signal transmission.

Figure 4:
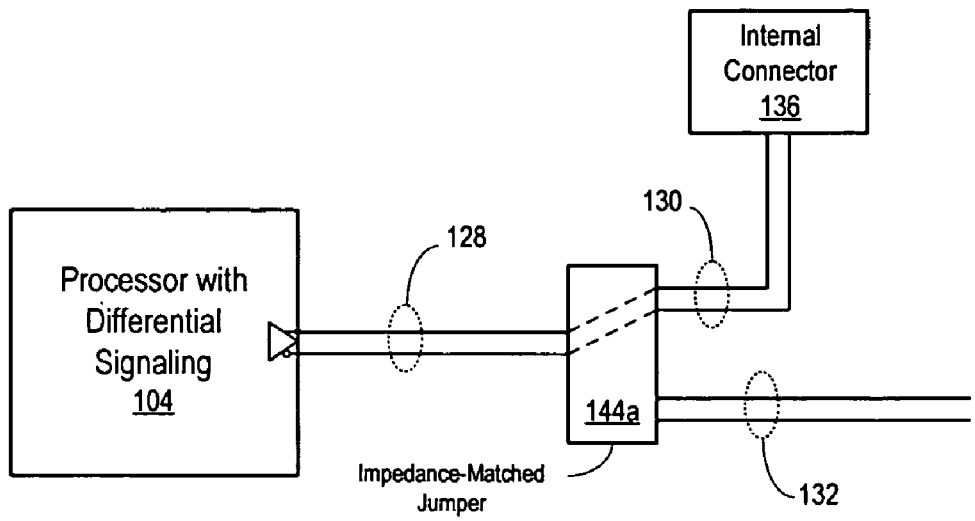
FIG. 4 is an illustration of a matched-impedance, high-bandwidth configuration jumper for connecting a first differential conductor pair on a circuit board to a second differential conductor pair associated with an internal connector.

Referring to FIG. 4, a processor 104 with differential signaling capability is connected to an impedance-matched jumper 144a that comprises internal impedance-matched conductors to transmit the signals to a differential conductor pair 130 connected to an internal connector 136 as illustrated above in FIG. 2. In the embodiment illustrated in FIG. 5, the processor 104 is connected by impedance-matched jumper 144b differential conductor pair 132 connected to an external connector 138 as illustrated in FIG. 2. In the various embodiments of the present invention, the impedance matched jumper is a passive connector having improved signal transmission characteristics to facilitate high data transmission rates. The internal impedance-matched conductors of jumpers 144a and 144b, therefore, do not comprise any active components, such as FETs, and are fixed in one of the two configurations illustrated in FIGS. 4 and 5. While the impedance-matched jumpers 144a and 144b shown in FIGS. 4 and 5, respectively, are described as being adapted to connect the first differential pair 128 to one of two possible secondary differential pairs 130 or 132, the present invention can be adapted to connect the first differential pair 128 to a secondary differential pair selected from a plurality (i.e., two or more) possible secondary differential pairs.

Figure 5:
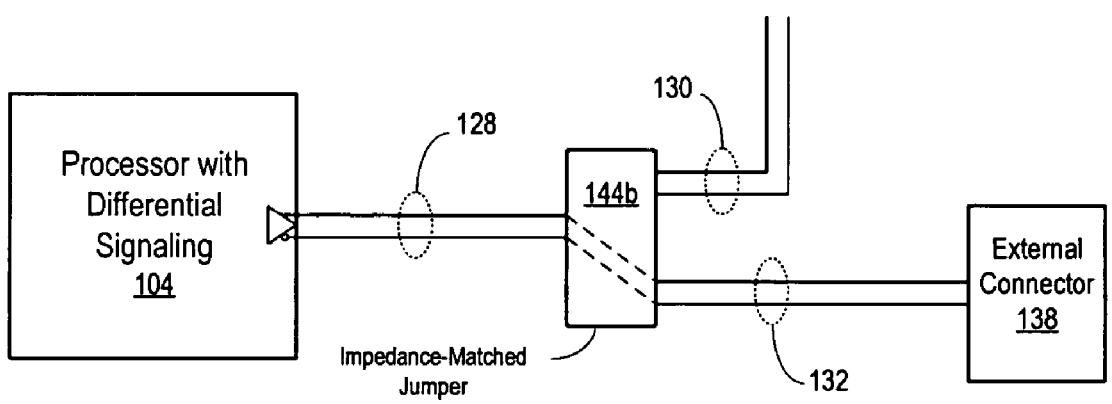
FIG. 5 is an illustration of a matched-impedance, high-bandwidth configuration jumper used to connect a first differential conductor pair on a circuit board to a second differential conductor pair associated with an external connector.
Figure 6:
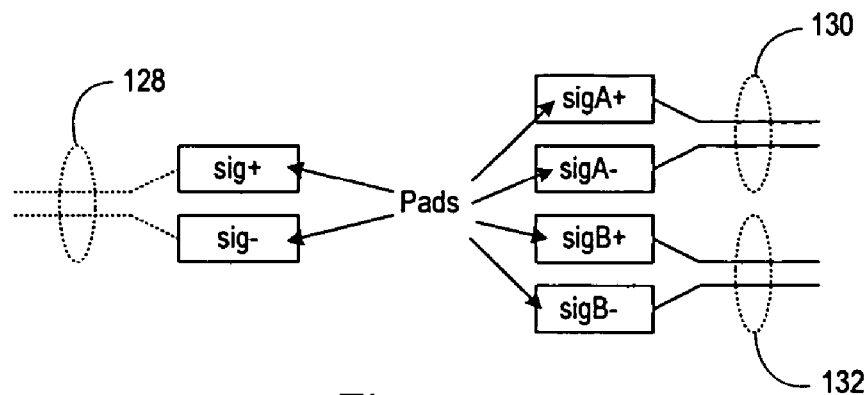
FIG. 6 is an illustration of a configuration of conductor pads for a first differential signal input conductor pair and first and second differential signal output conductor pairs.

FIG. 6 is an illustration of connection pads for the various conductor pairs illustrated in FIGS. 4 and 5. As can be seen in FIG. 6, differential conductor pair 128 is connected to a "signal +" and a "signal −" pad. The receiver differential conductor pair 130 is connected to a "signal A+" and a "signal A−" pair of conductor pads. Likewise, receiver conductor pair 132 is connected to "signal B+" and "signal B−" conductor pads.

Figure 7A:
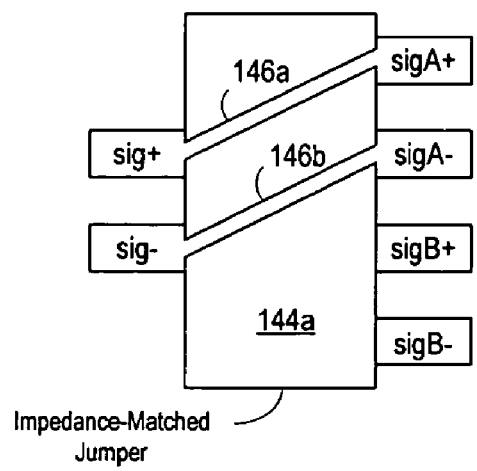
FIG. 7a is an illustration of a matched-impedance, high-bandwidth jumper operable to connect a first differential signal input conductor pair to a first differential signal output conductor pair in accordance with the conductor configuration shown in FIG. 6.
Figure 7B:
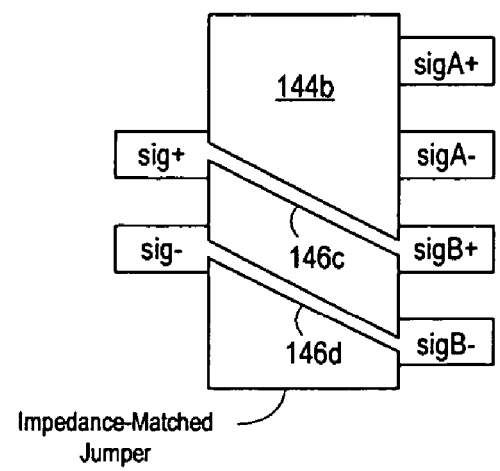
FIG. 7b is an illustration of a matched-impedance, high-bandwidth jumper operable to connect a first differential signal input conductor pair to a second differential signal output conductor pair in accordance with the conductor configuration shown in FIG. 6.

The embodiments of the impedance-matched jumpers 144a and 144b shown in FIGS. 7a and 7b, respectively, have connectors that are designed to attach to the corresponding pads shown in FIG. 6 to provide a matched-impedance connection. Each of the embodiments of the impedance-matched jumper provides internal conductors to transmit signals between the respective connector pads with minimal signal degradation. In particular, as discussed in greater detail below, the pad spacing and the conductor placement within the impedance-matched jumper provides a matched-impedance pass-through connector. Referring to FIG. 7a, impedance-matched jumper 144a comprises first and second internal conductors 146a and 146b that connect transmit connection pads "Sig +" and Sig −" to receive connection pads "Sig A+" and "Sig A−." The impedance-matched jumper 144b shown in FIG. 7b comprises first and second internal conductors 146c and 146d that connect transmit connection pads "Sig +" and Sig −" to receive connection pads "Sig B+" and "Sig B−."

FIGS. 8 and 9a,b illustrate an embodiment of the invention that provides enhanced bandwidth by adding a plurality of ground connection pads at predetermined locations with respect to the differential signal conductor pairs. As can be seen in FIG. 8, each of the connection pads for the transmit and receive differential conductor pairs are adjacent to a ground pad. The impedance-matched jumpers 144c and 144c shown in FIGS. 9a and 9b, respectively, have connectors that are designed to attach to the corresponding differential signal pads and ground pads shown in FIG. 8 to provide an enhanced matched-impedance connection. Using the embodiment of the invention shown in FIGS. 8 and 9a,b it is possible to control impedance more than +/−15% of the requirements for current 3 Gbps signal transmission standards and higher signal transmission speeds in the future.

Figure 10:
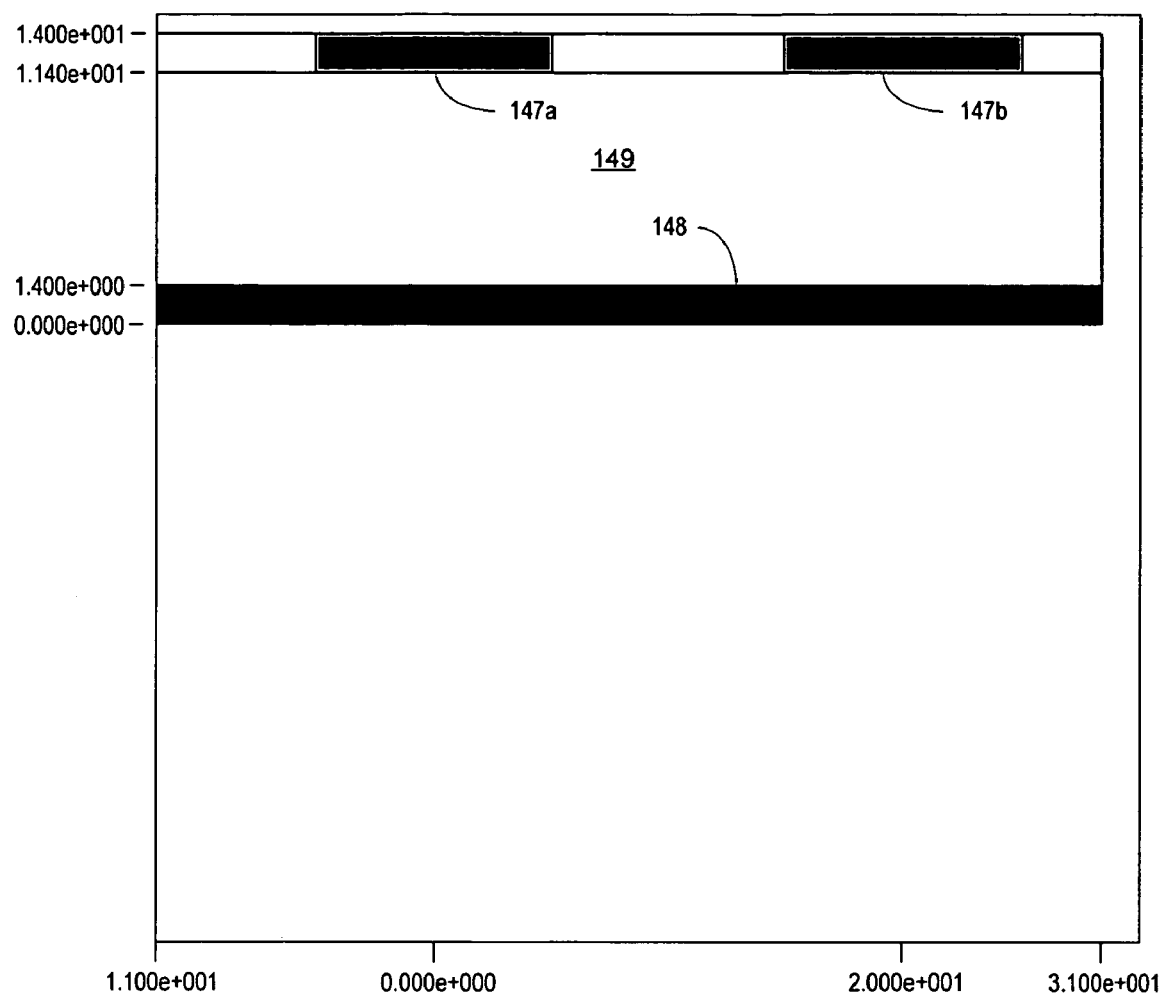
FIG. 10 is an illustration of layout geometries for conductor pads to create 100 ohms of differential impedance.
Figure 11:
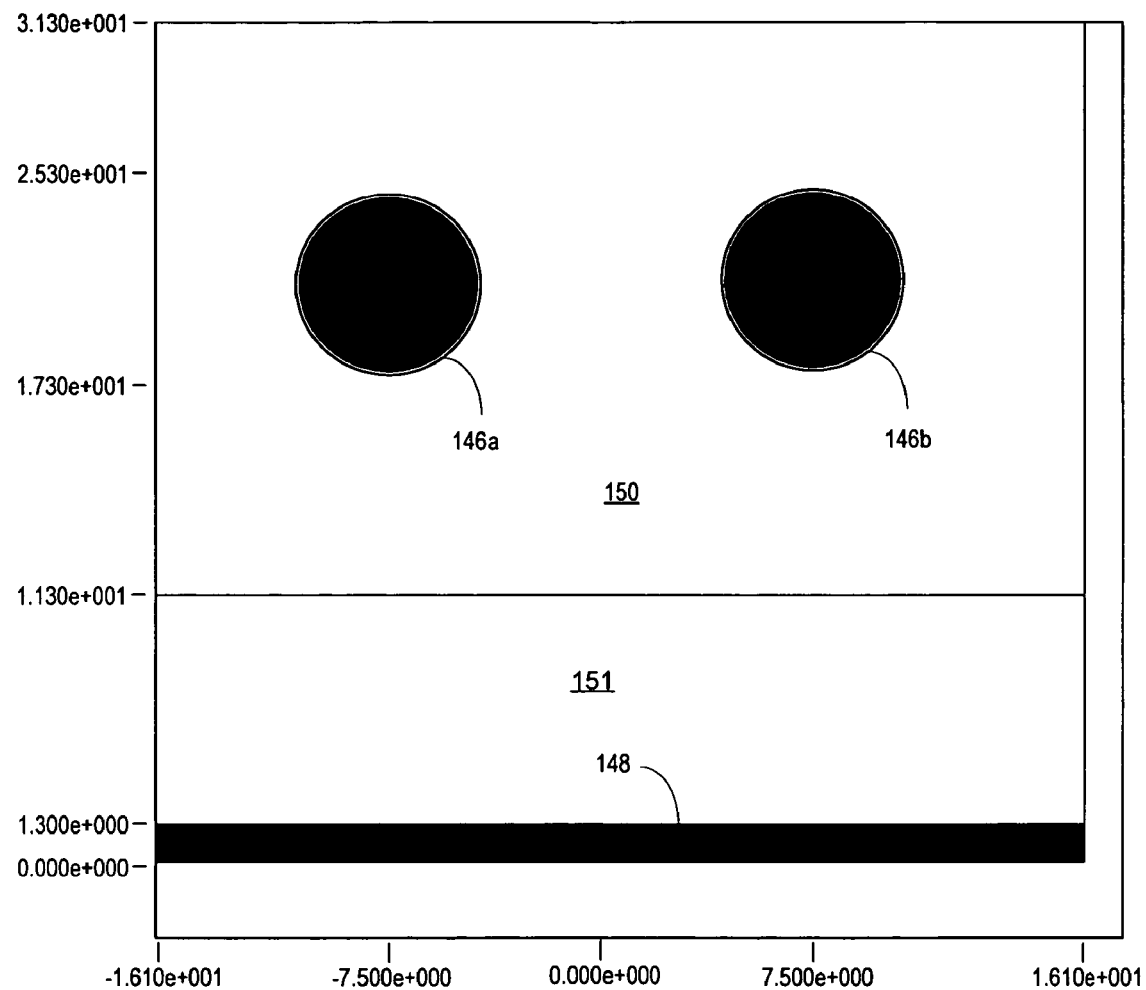
FIG. 11 is an illustration of layout geometries of a plurality of conductors embedded in a substrate with a predetermined spacing from a groundplane.

FIG. 10 shows example geometries for conductor pads 147a and 147b to create 100 ohms differential impedance in the various embodiments of the impedance controlled jumper of the present invention. The embodiment shown in FIG. 10 comprises 10-mil pads 147a and 147b on a 20-mil pitch spaced 10 mils above a ground 148. Above a 10-mil dielectric 149, the pads illustrated in FIG. 10 will create an impedance of 100 ohms. FIG. 11 shows example geometries of 8 mil conductors 146a and 146b embedded in a plastic substrate 150 and spaced 6 mils above a 10 mil dielectric 151 and a total of 16 mils above a ground 148. The examples of connector pads and internal conductors discussed above are representative examples of geometries that can provide improved differential signal performance in accordance with the present invention, but other geometries can be implemented in the scope of the present invention.

Although the present invention has been described in detail, it should be understood that various changes, substitutions and alterations can be made hereto without departing from the spirit and scope of the invention as defined by the appended claims.

What is claimed is:

1. A matched-impedance jumper for connecting a set of input differential signal conductors to a predetermined set of output differential signal conductors, comprising:

a plurality of input pins operable to connect with a plurality of connection pads on said first set of input differential signal conductors;

a plurality of output pins operable to connect with a plurality of connection pads on said set of output differential signal conductors;

a plurality of internal conductors operably connected to said input pins and said output pins to define a signal path therebetween;

wherein said signal path defined by said input pins, said output pins and said internal conductors provides a matched-impedance passthrough for differential signals.

2. The jumper according to claim 1, wherein said plurality of input pins and said plurality of output pins further comprise ground pins adjacent to said input pins and output pins.

3. The jumper according to claim 1, wherein said signal path comprises a point-to-point signal path.

4. The jumper according to claim 1, wherein said internal conductors are spaced a predetermined distance from a ground plane.

5. The jumper according to claim 1, wherein said internal conductors and said ground plane are encased in a plastic substrate.

6. A method of transmitting signals in a circuit, comprising:
    transmitting a plurality of data signals in a first pair of differential signal conductors;
    receiving said plurality of data signals in a second pair of differential signal conductors;
    wherein said first pair of differential signal conductors is coupled to said second pair of differential signal conductors by a matched-impedance jumper.

7. The method of claim 6, wherein said matched-impedance jumper comprises:
    a plurality of input pins operable to connect with a plurality of connection pads on said first pair of differential signal conductors;
    a plurality of output pins operable to connect with a plurality of connection pads on said second pair differential signal conductors; and
    a plurality of internal conductors operably connected to said input pins and said output pins to define a signal path therebetween; wherein said signal path defined by said input pins, said output pins and said internal conductors provides a matched-impedance passthrough for differential signals.

8. The method according to claim 6, wherein said plurality of input pins and said plurality of output pins further comprise ground pins adjacent to said input pins and output pins.

9. The jumper according to claim 6, wherein said signal path comprises a point-to-point signal path.

10. The jumper according to claim 6, wherein said internal conductors are spaced a predetermined distance from a ground plane.

11. A circuit board, comprising:
    a first pair of differential signal conductors;
    a plurality of second pairs of differential signal conductors;
    a matched-impedance jumper operable to connect said first pair of differential signal conductors to a predetermined second pair of differential signal conductors within said plurality of second pairs of differential signal conductors.

12. The circuit board according to claim 11, wherein said impedance-matched jumper comprises:
    a plurality of input pins operable to connect with a plurality of connection pads on said first pair of differential signal conductors;
    a plurality of output pins operable to connect with a plurality of connection pads on said predetermined second pair of differential signal conductors; and
    a plurality of internal conductors operably connected to said input pins and said output pins to define a signal path therebetween; wherein said signal path defined by said input pins, said output pins and said internal conductors provides a matched-impedance passthrough for differential signals.

13. The circuit board according to claim 11, wherein said plurality of input pins and said plurality of output pins further comprise ground pins adjacent to said input pins and output pins.

14. The circuit board according to claim 11, wherein said signal path comprises a point-to-point signal path.

15. The circuit board according to claim 11, wherein said internal conductors are spaced a predetermined distance from a ground plane.

16. An information handling system, comprising:
    at least one circuit board comprising information processing circuits and signal conductors, said circuit board further comprising:
    a first pair of differential signal conductors;
    a plurality of second pairs of differential signal conductors; and
    an impedance-matched jumper operable to connect said first pair of differential signal conductors to a predetermined second pair of differential signal conductors within said plurality of second pairs of differential signal conductors.

17. The information handling system according to claim 16, wherein said impedance-matched jumper comprises:
    a plurality of input pins operable to connect with a plurality of connection pads on said first pair of differential signal conductors;
    a plurality of output pins operable to connect with a plurality of connection pads on said predetermined second pair of differential signal conductors; and
    a plurality of internal conductors operably connected to said input pins and said output pins to define a signal path therebetween;
    wherein said signal path defined by said input pins, said output pins and said internal conductors provides a matched-impedance passthrough for differential signals.

18. The information handling system according to claim 16, wherein said plurality of input pins and said plurality of output pins further comprise ground pins adjacent to said input pins and output pins.

19. The information handling system according to claim 16, wherein said signal path comprises a point-to-point signal path.

20. The jumper according to claim 16, wherein said internal conductors are spaced a predetermined distance from a ground plane.

* * * * *